(12) United States Patent
Rosen

(10) Patent No.: US 9,088,288 B1
(45) Date of Patent: Jul. 21, 2015

(54) METHOD AND APPARATUS FOR CLOCK GENERATOR

(71) Applicant: Marvell Israel (M.I.S.L) Ltd., Yokneam (IL)

(72) Inventor: Eitan Rosen, Abirim (IL)

(73) Assignee: MARVELL ISRAEL (M.I.S.L.) LTD., Yokneam (IL)

( * ) Notice: Subject to any disclaimer, the term of this patent is extended or adjusted under 35 U.S.C. 154(b) by 193 days.

(21) Appl. No.: 13/735,686

(22) Filed: Jan. 7, 2013

Related U.S. Application Data

(63) Continuation-in-part of application No. 12/707,142, filed on Feb. 17, 2010, now Pat. No. 8,354,857.

(60) Provisional application No. 61/604,285, filed on Feb. 28, 2012, provisional application No. 61/604,294, filed on Feb. 28, 2012, provisional application No. 61/155,323, filed on Feb. 25, 2009.

(51) Int. Cl.
| | |
|---|---|
| H03L 7/00 | (2006.01) |
| H03K 7/00 | (2006.01) |
| H03K 5/135 | (2006.01) |
| H03K 3/03 | (2006.01) |

(52) U.S. Cl.
CPC ............... *H03L 7/00* (2013.01); *H03K 3/0315* (2013.01); *H03K 5/135* (2013.01); *H03K 7/00* (2013.01)

(58) Field of Classification Search
CPC ...... H03L 7/00; H03L 7/0995; H03K 3/0315; H03K 5/135; H03K 2005/00293
USPC ......... 327/291, 298, 299; 331/57; 326/93, 96, 326/98
See application file for complete search history.

(56) References Cited

U.S. PATENT DOCUMENTS

| | | | |
|---|---|---|---|
| 5,818,250 A | 10/1998 | Yeung et al. | |
| 6,657,504 B1 | 12/2003 | Deal et al. | |
| 6,668,346 B1 | 12/2003 | Schulz et al. | |
| 6,853,177 B2 | 2/2005 | Shibayama et al. | |
| 6,933,739 B1 | 8/2005 | Rosen | |
| 7,348,857 B1 | 3/2008 | Ecker et al. | |
| 7,459,952 B2 * | 12/2008 | Ogita | 327/239 |
| 2004/0108866 A1 | 6/2004 | Burns et al. | |
| 2005/0231293 A1 * | 10/2005 | Confalonieri et al. | 331/57 |
| 2007/0096836 A1 * | 5/2007 | Lee et al. | 331/57 |

OTHER PUBLICATIONS

Franch, R., et al., "On-chip Timing Uncertainty Measurements on IBM Microprocessors," IEEE International Test Conference, pp. 1-7, 2007.

(Continued)

*Primary Examiner* — John Poos

(57) ABSTRACT

Aspects of the disclosure provide a clock generator circuit that includes a first pulse generator and a second pulse generator cross-coupled together. The first pulse generator is configured to output first pulses. Each first pulse has a first leading edge, a first trailing edge, and a first pulse width corresponding to a first delay time that is based on a first number of inversions. The second pulse generator is configured to output second pulses. Each second pulse has a second leading edge, a second trailing edge, and a second pulse width corresponding to a second delay time that is based on a second number of inversions. The first pulse generator outputs one of the first pulses in response to the second trailing edge, and the second pulse generator outputs one of the second pulses in response to the first trailing edge.

17 Claims, 9 Drawing Sheets

(56) References Cited

OTHER PUBLICATIONS

Altera Corporation, The Programmable Solutions Company, Extended Temperature Support for Cyclone Devices, San Jose, CA Jul. 2004, ver 1.1.
B. Gill et al., IEEE, An Efficient BICS Design for SEUs Detection and Correction in Semiconductor Memories, 2005.
Zaryab Hamavand, National Semiconductor Corporation, Analog Edge, Temperature Sensor Solutions for Low-Voltage Systems, 2005.
Maxim-ic.com, Dallas Semiconductor, How Delay Lines Work, App Note 209, Aug. 2002.
EDACafe.com, Tower Semiconductor adopts Legend's CharFlo-Memory! for quality assurance of commercially available memory compliers., Santa Clara, CA Dec. 15, 2003.

* cited by examiner

| DELAY (#INVERSIONS) | SELECTION | POLARITY | INITIALIZATION |
|---|---|---|---|
| 1 | 001 | 1 | 1111 |
| 2 | 010 | 0 | 1111 |
| 3 | 011 | 1 | 1111 |
| 4 | 100 | 0 | 1111 |
| 5 | 101 | 1 | 1111 |
| 6 | 110 | 0 | 1111 |
| 7 | 111 | 1 | 1111 |
| 8 | 001 | 0 | 1111 |
| 9 | 010 | 1 | 1111 |
| 10 | 011 | 0 | 1111 |
| 11 | 100 | 1 | 1111 |
| 12 | 101 | 0 | 1111 |
| 13 | 110 | 1 | 1111 |
| 14 | 111 | 0 | 1111 |
| 15 | 001 | 1 | 1110 |
| 16 | 010 | 0 | 1110 |
| ⋮ | ⋮ | ⋮ | ⋮ |

FIG. 3

METHOD AND APPARATUS FOR CLOCK GENERATOR

INCORPORATION BY REFERENCE

This application claims the benefit of U.S. Provisional Applications No. 61/604,285, "An Agile Clock Generator for Gals Modules" filed on Feb. 28, 2012, and No. 61/604,294, "Clock to Clock Synchronizer Module" filed on Feb. 28, 2012, and is a Continuation-in-part of U.S. patent application Ser. No. 12/707,142, "Method and Apparatus for Speed Monitoring" filed on Feb. 17, 2010, which in turn claims the benefit of U.S. Provisional Application No. 61/155,323, "Inversion Counter for Speed Monitoring" filed on Feb. 25, 2009. The entire disclosures of the prior applications are incorporated by reference herein in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A phase locked loop (PLL) based clock generator generates a clock signal with reference to an oscillation signal having a relatively stable frequency, such as an oscillation signal generated by a crystal oscillator external to an integrated circuit (IC) chip. Thus, the frequency of the clock signal is stable and does not vary with process, voltage, and temperature changes of the IC chip.

SUMMARY

The PLL based clock generator lacks flexibility with the changes, such as process, voltage, temperature changes of an IC chip.

Aspects of the disclosure provide a clock generator circuit that includes a first pulse generator and a second pulse generator cross-coupled together. The first pulse generator is configured to output first pulses. Each first pulse has a first leading edge, a first trailing edge, and a first pulse width corresponding to a first delay time that is based on a first number of inversions. The second pulse generator is configured to output second pulses. Each second pulse has a second leading edge, a second trailing edge, and a second pulse width corresponding to a second delay time that is based on a second number of inversions. The first pulse generator outputs one of the first pulses in response to the second trailing edge, and the second pulse generator outputs one of the second pulses in response to the first trailing edge.

According to an aspect of the disclosure, the first pulse generator includes a first ring oscillator module having first inversion stages, a first edge capture module, and a first controller. The first edge capture module is configured to capture a first target edge of a first signal propagating in the first ring oscillator module corresponding to the first number of inversions. The first controller is configured to output the first leading edge and control the first ring oscillator module to start oscillating in response to the second trailing edge, and to output the first trailing edge when the first edge capture module captures the first target edge. The second pulse generator includes similar components.

In an embodiment, the first pulse generator further includes a selection module configured to select a stage out of the first inversion stages of the first ring oscillator module that the first signal propagates to the stage at the first number of inversions. In an example, the selection module includes a multiplexer module coupled to the first inversion stages of the first ring oscillator module.

Further, in an embodiment, the first edge capture module further comprises a counter module configured to count transition edges. The first controller is configured to provide an initialization signal to the counter module based on the first target edge, and the counter module is initialized based on the initialization signal, and is configured to capture the first target edge when the counter module overflows.

In addition, in an example, the first edge capture module includes an exclusive-or (XOR) module configured to adjust a transition direction of the transition edges. Then, the first controller is configured to provide a polarity signal to the XOR module for adjusting the transition direction of the transition edges.

Further, in an example, the first ring oscillator module includes an inversion stage having at least two different inversion delays.

Aspects of the disclosure also provide an integrated circuit (IC) chip. The integrated circuit chip includes the clock generator circuit, and a functional circuit configured to operate in response to a clock signal formed based on the first pulses.

Aspects of the disclosure provide a method of generating a clock signal. The method includes generating first pulses, by a first pulse generator, in response to trailing edges of second pulses generated by a second pulse generator. A first pulse width of the first pulses corresponds to a first delay time that is based on a first number of inversions. Further, the method includes generating the second pulses, by the second pulse generator, in response to trailing edges of the first pulses generated by the first pulse generator. A second pulse width of the second pulses corresponds to a second delay time that is based on a second number of inversions.

BRIEF DESCRIPTION OF THE DRAWINGS

Various embodiments of this disclosure that are proposed as examples will be described in detail with reference to the following figures, wherein like numerals reference like elements, and wherein:

FIG. 3 shows a table 300 of control signal examples according to an embodiment of the disclosure;

DETAILED DESCRIPTION OF EMBODIMENTS

Figure 1:
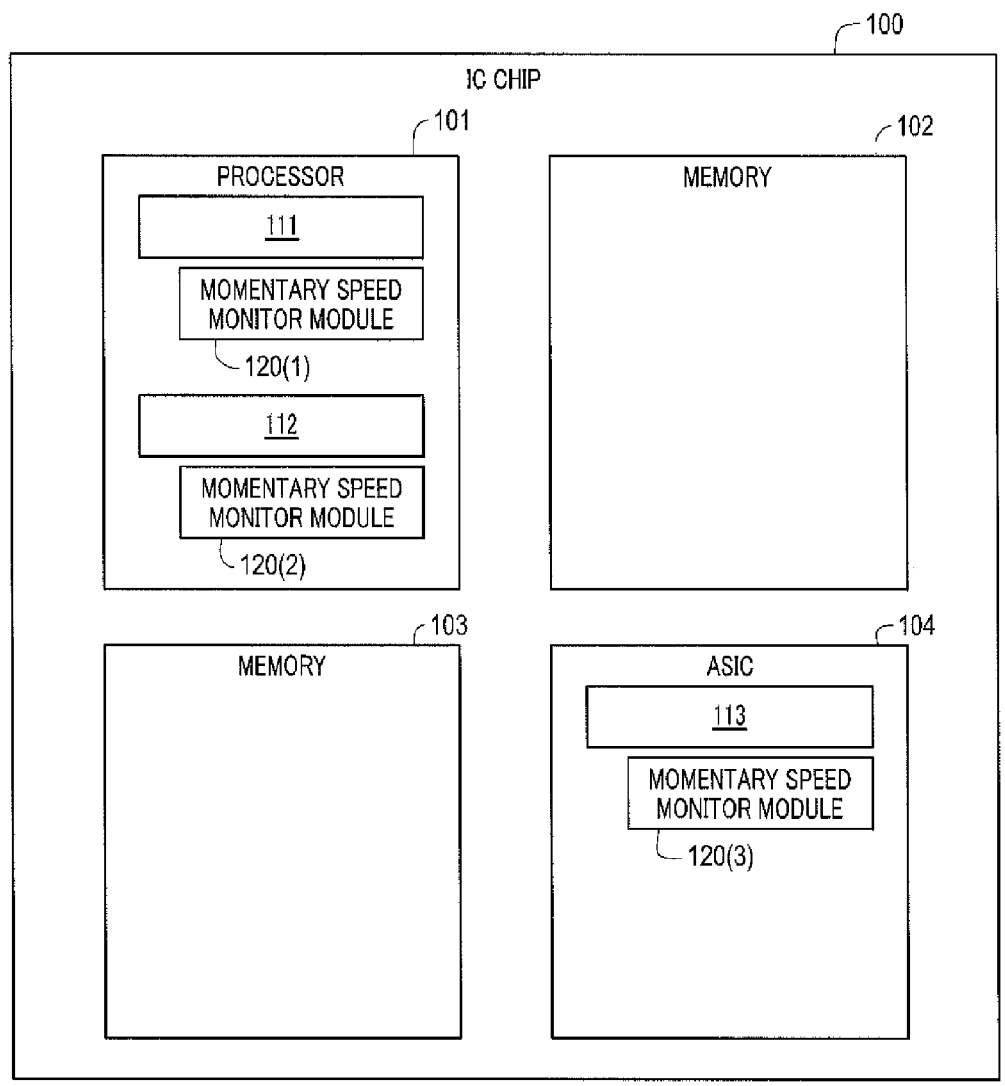
FIG. 1 shows a block diagram of an integrated circuit (IC) chip example 100 according to an embodiment of the disclosure.

FIG. 1 shows a block diagram of an integrated circuit (IC) chip example 100 according to an embodiment of the disclosure. The IC chip 100 includes various operational modules 101-104, such as a processor module 101, memory module 102-103, an application specific integrated circuit (ASIC) module 104, and the like. It is noted that different modules and different quantities of circuit modules are suitably found in IC chips. In addition, the IC chip 100 includes momentary speed monitor modules 120(1-3) for monitoring circuit speed. The momentary speed monitor modules 120(1-3) are suitably distributed in the IC chip 100 at locations of interest. In accordance with an embodiment, at least one momentary speed monitor module 120 is associated with one of the operational modules 101-104 to monitor a speed of its associated operational module, and detect speed variations of the associated operational module. Such variations in speed are the result of process, temperature and/or voltage variations, which in some applications are localized.

In an embodiment, the IC chip 100 includes critical circuits 111-113, such as critical paths, and the like, that have a relatively higher possibility of failure. The momentary speed monitor modules 120(1-3) are suitably distributed in neighborhoods of the critical circuits 111-113. In addition, in an embodiment, a momentary speed monitor module 120 is suitably coupled to a selected critical circuit. For example, the momentary speed monitor module 120(1) receives a clock signal from a same branch of a clock tree as the critical circuit 111. In another example, a power supply of the momentary speed monitor module 120(1) travels a substantially same power supply path as a power supply of the critical circuit 111.

In accordance with an embodiment, the critical circuits 111-113 are determined by any suitable mechanism. In addition, the critical circuits 111-113 can be determined from various aspects, such as a relatively small margin for operation, a relatively higher sensitivity to an environmental parameter, and the like. Thus, the critical circuits 111-113 have a relatively higher possibility of failing with respect to changes of environmental parameters.

In an example, the critical circuit 111 includes a critical path. The critical path is a signal propagating path in a combinational logic that has a relatively large delay value. The relatively large delay value can be close to a clock cycle, thus the critical path has a relatively strict delay margin. The momentary speed monitor module 120(1) is placed in a neighborhood of the critical circuit 111 to monitor a speed variation in the neighborhood. In another example, the critical circuit 112 is sensitive to a voltage supply variation. The momentary speed monitor module 120(2) is placed in a neighborhood of the critical circuit 112 and is suitably coupled to the critical circuit 112 to detect the voltage supply variation by suitably detecting the speed variation. In another example, the critical circuit 113 is sensitive to a temperature variation. The momentary speed monitor module 120(3) is placed in a neighborhood of the critical circuit 113 to detect the temperature variation by suitably detecting the speed variation.

In another embodiment, a momentary speed monitor module 120 is used for localized speed monitoring. When the momentary speed monitor module 120 detects a relatively slow speed at a location, an operational module at the location can have delay faults due to the relatively slow speed. In an example, the operational module is suitably configured, such as increasing the supply voltage, and the like, to increase the speed. When the momentary speed monitor module 120 detects a relatively fast speed at the location, the operational module at the location can suffer from a localized heat-up. In an example, the operational module is suitably configured, such as reducing the supply voltage, and the like, to reduce the speed.

According to an embodiment of the disclosure, a momentary speed monitor module 120 includes a ring oscillator and additional circuitry coupled to the ring oscillator to enable momentary speed monitoring. The momentary speed monitor module 120 is configured to detect a target signal transition edge at a stage of the ring oscillator, and determine a speed of the ring oscillator based on the detected target signal transition edge and edges of a clock signal. In an example, the ring oscillator is enabled to start oscillating in response to a first rising edge of the clock signal. When the target signal transition edge at the stage of the ring oscillator is detected, the momentary speed monitor module 120 determines the speed of the ring oscillator based on a timing of the target signal transition edge, and a timing of a second rising edge of the clock signal. For example, when the target signal transition edge is ahead of the second rising edge of the clock signal, the momentary speed monitor module 120 determines that the speed of the ring oscillator is fast enough for the target signal transition edge to incur before the second rising edge of the clock signal; and when the target signal transition edge follows the second rising edge of the clock signal, the momentary speed monitor module 120 determines that the speed of the ring oscillator is not fast enough for the target signal transition edge to incur before the second rising edge of the clock signal.

It is noted that the target signal transition edge at the stage of the ring oscillator can be any signal transition edge at the stage, such as a first rising edge, a first falling edge, a second rising edge, a second falling edge, and the like.

In addition, the target signal transition edge can be suitably chosen for various speed monitoring purposes. In an example, the target signal transition edge is chosen to correspond to a lower speed boundary of an operational module. For example, a time (a delay) of the target signal transition edge to the first rising edge of the clock signal corresponds to a delay of a critical path of the operational module. Thus, when the target signal transition edge follows the second rising edge of the clock signal, for example, the critical path can have a delay error. In another example, the target signal transition edge is chosen to correspond to an upper speed boundary. Thus, when the target signal transition edge is ahead of the second rising edge of the clock signal, the speed of the operational module is too fast, and may cause local heat-up.

In an embodiment, the momentary speed monitor module 120 detects a speed in a momentary manner. In an example, the first rising edge and the second rising edge of the clock signal are successive rising edges. Thus, the momentary speed monitor module 120 monitors a delay error in a single clock cycle, such as in 1 ns for 1 GHz clock frequency.

Accordingly, in an embodiment, the speed monitoring module can be employed as a momentary speed monitor module to detect speed variations caused by momentary variations. In an example, a leakage path in a circuit is input pattern dependent. When the leakage path is activated by an input pattern, the leakage causes a voltage drop in the voltage supply. The voltage drop can happen in a first clock cycle, and may or may not happen in next clock cycles. The voltage drop in the first clock cycle increases delays, and may cause delay errors in the first clock cycle. However, delays in the next clock cycles may be normal.

The momentary speed monitor module 120 can be suitably configured, for example, by choosing the stage, the target signal transition edge, and the like, to detect the voltage drop in the first clock cycle. For example, the stage and the target signal transition edge are suitably chosen, such that when the supply voltage is normal, the target signal transition edge is ahead of the second rising edge of the clock signal, and when a voltage drop happens, the target signal transition edge follows the second rising edge of the clock signal. Thus, when the voltage drop happens in the first clock cycle, the momentary speed monitor module 120 detects a delay error in the first clock cycle.

In a related speed monitor example, a speed is monitored based on a frequency measurement of a ring oscillator. Generally, the frequency of the ring oscillator is measured over a time duration, such as 1 μs. Thus, a voltage drop in a single clock cycle may not significantly change the frequency of the ring oscillator over the time duration. Therefore, the ring oscillator frequency based speed monitoring may not detect the voltage drop in the single clock cycle.

According to another aspect of the disclosure, a momentary speed monitor module 120 consumes a relatively small silicon area. More specifically, the momentary speed monitor module 120 detects a delay error based on a target signal transition edge at a single stage of a ring oscillator. The ring oscillator can use a relatively small number of inverters to generate a delay of a relatively large number of inversions. In addition, the momentary speed monitor module 120 does not need a large number of edge capture circuits to capture signal transition edges at a large number of stages. Thus, the momentary speed monitor module 120 consumes a relatively small silicon area. In an implementation example, a momentary speed monitor module 120 consumes 30 μm by 20 μm in a 65 nm technology.

Further, according to an embodiment, a momentary speed monitor module 120 can be software configurable. In an example, the momentary speed monitor module 120 receives a control vector. In an embodiment, the control vector indicates a number of inversions corresponding to a speed specification, such as a lower speed boundary, an upper speed boundary, and the like. Based on the control vector, the momentary speed monitor module 120 selects a stage of the ring oscillator by sending a selection signal to a multiplexer, for example. Further, based on the control vector, the momentary speed monitor module 120 counts a number of transitions at the stage to detect the target signal transition edge.

Figure 2:
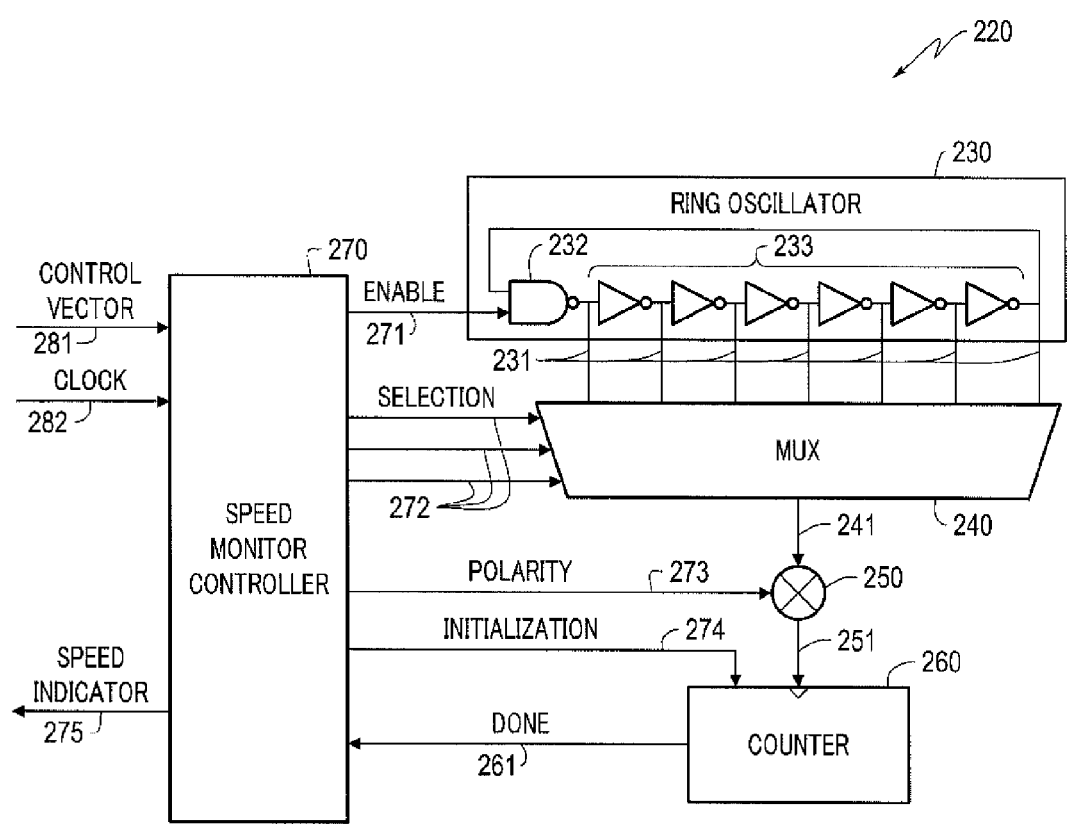
FIG. 2 shows the block diagram of a counter based momentary speed monitor module example 220 according to an embodiment of the disclosure.

FIG. 2 shows a counter based momentary speed monitor module example 220 according to an embodiment of the disclosure. The counter based momentary speed monitor module 220 includes a ring oscillator module 230, a multiplexer module 240, an XOR module 250, a counter module 260, and a speed monitor controller module 270. These elements can be coupled together as shown in FIG. 2.

The ring oscillator module 230 includes an N-stage ring oscillator. The ring oscillator module 230 receives an enable signal 271 from the speed monitor controller module 270, and outputs a plurality of stage signals 231. In an example, each stage outputs a stage signal 231. The enable signal 271 enables or disables the N-stage ring oscillator. In the FIG. 2 example, the ring oscillator module 230 includes a seven-stage ring oscillator. The seven-stage ring oscillator includes a NAND gate 232 and six inverters 233 formed in a ring. When the enable signal 271 is logic "0", the seven-stage ring oscillator stops oscillating. When the enable signal 271 is logic "1", the seven-stage ring oscillator starts oscillating. Each stage provides a stage signal 231. The stage signals 231 are provided to the multiplexer module 240.

The multiplexer module 240 receives the plurality of stage signals 231 from the ring oscillator module 230, and a selection signal 272 from the speed monitor controller module 270. The selection signal 272 indicates which of the stage signals 231 is to be selected by the multiplexer module 240. Based on the selection signal 272, the multiplexer module 240 selects one of the stage signals 231. In the FIG. 2 example, the multiplexer module 240 receives seven stage signals 231 from the ring oscillator module 230, and receives a 3-bit selection signal 272, indicated by three arrows 272 from the speed monitor controller 270. Based on the 3-bit selection signal 272, the multiplexer module 240 selectively outputs one of the stage signals 231 as a selected stage signal 241.

The XOR module 250 receives the selected stage signal 241 and a polarity signal 273 from the speed monitor controller module 270, executes a XOR operation of the selected stage signal 241 and the polarity signal 273 to generate a counter trigger signal 251, and provides the counter trigger signal 251 to the counter module 260. The polarity signal 273 is provided by the speed monitor controller module 270 to suitably adjust a transition direction of a target signal transition edge with regard to the counter module 260. In an example, the counter module 260 is rising edge triggered. When the target signal transition edge at a stage of the ring oscillator module 230 is a rising edge, the speed monitor controller module 270 provides "0" as the polarity signal 273. However, when the target signal transition edge is a falling edge, the speed monitor controller module 270 provides "1" as the polarity signal 273. It is noted that when the counter module 260 is falling-edge triggered, the polarity signal 273 can be suitably adjusted to change the transition direction of the target signal transition edge to be falling edge.

The counter module 260 counts transitions (rising edges or falling edges) in the counter trigger signal 251, detects the target signal transition edge, and provides a done signal 261 to the speed monitor controller module 270 based on the detection. In an example, the counter module 260 includes a rising edge counter, and the target signal transition edge is a third rising edge, such as a third rising edge at the first stage of the ring oscillator module 230 for monitoring a speed of 36 inversions. The counter module 260 outputs logic "0" as the done signal 261 before receiving three rising edges, and sets the done signal 261 to logic "1" when three rising edges are received.

In another example, the counter module 260 is configured to set the done signal 261 to logic "1" when the rising edge counter overflows. Supposing the rising edge counter is a 4-bit counter, the rising edge counter can be initialized to "1101". Thus, when the rising edge counter counts three rising edges, the rising edge counter overflows, and the counter module 260 sets the done signal 261, e.g. "1". In an embodiment, the speed monitor controller 270 provides an initialization signal 274 to the counter module 260. Based on the initialization signal 274, the counter module 260 initializes the rising edge counter.

The speed monitor controller 270 receives a control vector 281, a clock signal 282. Based on the control vector 281, the speed monitor controller 270 provides the selection signal 272 to the multiplexer module 240, the polarity signal 273 to the XOR module 250, and the initialization signal 274 to the counter module 260. The selection signal 272 is provided to the multiplexer module 240 to select one of the stage signals 231. The polarity signal 273 is provided to the XOR module 250 to suitably adjust the transition direction of the selected stage signal 241. The initialization signal 274 initializes the counter module 260 to a suitable initialization number. Then, based on the clock signal 282, the speed monitor controller module 270 provides the enable signal 271 to the ring oscillator module 230 to start oscillation. The speed monitor controller module 270 receives the done signal 261 when the target signal transition edge is detected. Based on the done signal 261 and the clock signal 282, the speed monitor controller 270 provides a speed indicator signal 275. The speed monitor controller 270 includes any suitably logic to compare timings of the done signal 261 and the clock signal 282, and generate the speed indicator signal 275. In an example, the speed monitor controller 270 includes a sampling circuit that samples the done signal 261 based on the clock signal 282. Based on the sampled done signal 261, the speed monitor controller 270 generates the speed indicator signal 275. In an embodiment, the speed indicator signal 275 indicates whether there is a delay error.

During operation, for example, the speed monitor controller module 270 receives a control vector 281. The control vector 281 is indicative of a target delay to monitor in the form of a number of inversions, for example. Based on the number of the inversions to monitor, the speed monitor controller module 270, determines the selection signal 272, the polarity signal 273, and the initialization signal 274. In an example, the number of inversions is twenty-one. Accordingly, the speed monitor controller module 270 provides "111" as the selection signal 272 to select the seventh stage of the seven-stage ring oscillator. Further, due to the reason the twenty-first inversion is a falling edge, the delay monitor control module 270 provides "1" as the polarity signal 273. In addition, the delay monitor control module 270 provides "1110" to the counter module 260 to initialize the 4-bit rising edge counter, due to the reason the twenty-first inversion is the second falling edge at the seventh stage.

Further, the speed monitor controller module 270 sets the enable signal 271 in response to a first rising edge in the clock signal 282 to enable the ring oscillator module 230 to oscillate. The multiplexer module 240 selects the seventh stage signal as the selected stage signal 241. The XOR module 250 suitably adjusts the transition direction of the counter trigger signal 251. The counter module 260 counts in response to rising edges in the counter trigger signal 251, for example. Thus, when the seventh stage signal has a first falling edge, the counter trigger signal 251 has a first rising edge. The first rising edge triggers the counter module 260 to count one more, and the counter module 260 becomes "1111". When the seventh stage signal has a second falling edge, the counter trigger signal 251 has a second rising edge. The second rising edge triggers the counter module 260 to count one more, and causes the counter module 260 to overflow. Upon overflow of the counter module 260, the counter module 260 sets the done signal 261 to logic "1".

When the speed monitor controller module 270 receives "1" in the done signal 261, the speed monitor controller module 270 compares a timing of the done signal 261 with a second rising edge of the clock signal 282. When the done signal 261 follows the second rising edge of the clock signal 282, the speed monitor controller module 270 sets the speed indicator signal 275 to "1" to indicate a detected delay error.

In an example, the speed monitor controller module 270 includes a sampling circuit that samples the done signal 261 at the second rising edge of the clock signal 282. When the sampled done signal 261 is "0", the speed monitor controller module 270 determines that the done signal 261 follows the second rising edge of the clock signal 282, and outputs logic "1" in the speed indictor signal 275 to indicate that the target delay (in the term of the number of inversions) is longer than a clock cycle, for example. When the sampled done signal 261 is "1", the speed monitor controller module 270 determines that the done signal 261 is ahead of the second rising edge of the clock signal 282, and outputs logic "0" in the speed indictor signal 275 to indicate that the target delay (in the term of the number of inversions) is shorter than a clock cycle, for example. It is noted that the speed monitor controller module 270 can use any other suitable technique to compare the timings of the done signal 261 and the second rising edge of the clock signal 282.

It is noted that various changes can be made to the counter based momentary speed monitor module 220. In an example, the counter module 260 is falling edge triggered. In another example, the speed monitor controller module 270 operates based on falling edges of the clock signal 282. In another example, the NAND gate 232 is suitably configured to have a relatively shorter delay, such as a half delay of a normal inversion, in response to the enable signal 271. Such configuration improves a delay monitoring resolution in the order of a half-inversion.

It is also noted that the first rising edge and the second rising edge can be successive rising edges or can be non-successive rising edges.

It is also noted that the counter based speed monitor module 220 can be simplified. In an example, the counter based speed monitor module 220 is placed in a neighborhood of a critical path. The critical path has a delay that can be suitably determined during design. Thus, the counter based speed monitor module 220 can be suitably configured during design. For example, the stage signal is selected during design, thus the multiplexer module 240 is not needed.

It is also noted that the ring oscillator module 230, the multiplexer module 240, the XOR module 250, and the counter module 260 form an inversion counter that counters inversions propagated in the ring oscillator module 230 up to a target number. The target number is programmable and can be programmed by defining the selection signal 272, the polarity signal 273 and the initialization signal 274. In addition, the inversion counter has a high resolution, such as a resolution of single inversion, or a resolution of half inversion.

FIG. 3 shows a table 300 of control signal examples provided by the speed monitor controller 270 according to an embodiment of the disclosure. The table 300 includes a delay field 310, a selection signal field 320, a polarity signal field 330, and an initialization signal field 340. The delay field 310 indicates a delay value in the form of a number of inversions. The selection signal field 320 includes a three-bit binary value for configuring the multiplexer module 240 to select a stage signal. The polarity signal field 330 includes a one-bit binary value to configure the XOR module 250 to suitably adjust transition direction with regard to the counter module 260. The initialization signal field 340 includes a four-bit binary value for initializing the counter module 260.

Figure 4:
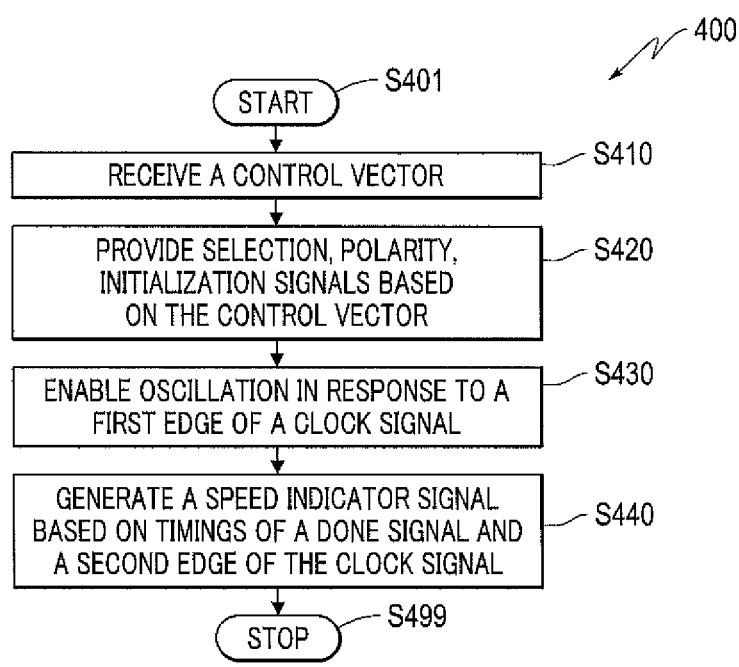
FIG. 4 shows a flowchart outlining a process example 400 for a speed monitor controller example to generate a speed indicator signal according to an embodiment of the disclosure.

FIG. 4 shows a flowchart outlining a process example 400 for the speed monitor controller module 270 to monitor a delay according to an embodiment of the disclosure. The process starts at S401, and proceeds to S410.

At S410, the speed monitor controller module 270 receives a control vector. The control vector can be provided by a higher level controller, such as a test controller, a speed controller, and the like. In an example, the test controller is within a tester that applies various tests on an IC chip having the counter based momentary speed monitor module 220. In another example, the test controller is a build-in self-test controller within a same chip as the counter based momentary speed monitor module 220.

In an embodiment, the control vector includes a mode field and a delay field. The mode field indicates an appropriate mode, such as an idle mode, monitoring mode, and the like, for configuring the counter based momentary speed monitor module 220. The delay field indicates a delay value for monitoring, such as in the form of a number of inversions.

At S420, the speed monitor controller module 270 provides the selection signal 272 to the multiplexer module 240, the polarity signal 273 to the XOR module 250, and initialization signal 274 to the counter module 260 based on the number of inversions for monitoring. In an example, the speed monitor controller module 270 determines a stage of the ring oscillator module 230 for monitoring, and a target edge at the stage corresponding to the number of inversions. Based on the stage, the speed monitor controller module 270 determines the selection signal 272. Based on the target edge and the counter module 260, the speed monitor controller module 270 determines the polarity signal 273. Further, based on the target edge, the speed monitor controller module 270 determines the initialization signal 274.

In another example, the speed monitor controller module 270 includes the table 300. Based on the table 300, the speed monitor controller module 270 determines the selection signal 272, the polarity signal 273, and initialization signal 274 based on the number of inversions for monitoring. It is noted that the speed monitor controller module 270 can use any other suitable technique, such as logic calculation, and the like, to determine the selection signal 272, the polarity signal 273, and initialization signal 274.

At S430, the speed monitor controller module 270 enables the ring oscillator module 230 to start oscillating in response to a first edge, such as a first rising edge of the clock signal 282. More specifically, in an embodiment, the speed monitor controller module 270 sets the enable signal 271 to logic "1" in response to the first rising of the clock signal 282. The enable signal 271 enables the ring oscillator module 230 to start oscillating. The multiplexer module 240 selects one of the stage signals 231. The XOR module 250 adjusts transition direction of the selected stage signal 241 based on the target transition and the counter module 260. The counter module 260 counts a number of transition edges in the counter trigger signal 251, and sets the done signal 261 to logic "1" when it overflows.

At S440, the speed monitor controller module 270 receives the done signal 261, and generates the speed indicator signal 275 based on the timings of the done signal 261 and a second edge, such as a second rising edge, of the clock signal 282. For example, when the done signal 261 is ahead of the second rising edge, the speed monitor controller module 270 determines that the delay (the time for the number of inversions) is smaller than a clock cycle, for example, and outputs "0" in the speed indicator signal 275. When the done signal 261 follows the second rising edge, the speed monitor controller module 270 determines that the delay (the time for the number of inversions) is larger than a clock cycle, for example, and outputs "1" as the speed indicator signal 275. Then, the process proceeds to S499, and terminates.

According to an embodiment of the disclosure, the counter based speed monitor module 220 can be used for various characterization, debugging, speed-power configuring, and the like.

Figure 5:
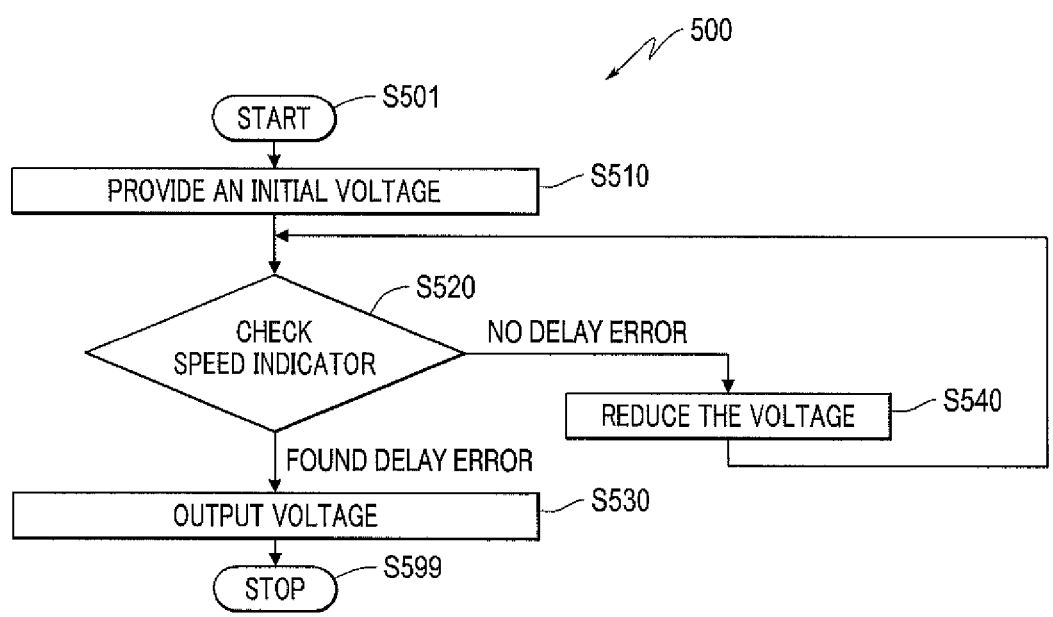
FIG. 5 shows a flowchart outlining a process example 500 for a test controller to characterize a voltage tolerance according to an embodiment of the disclosure.

FIG. 5 shows a flowchart outlining a process example 500 for a test controller to characterize a voltage tolerance using the counter based speed monitor module 220 according to an embodiment of the disclosure. In an example, the test controller is within a tester that applies various tests on an IC chip having the counter based momentary speed monitor module 220. In another example, the test controller is a built-in self-test controller within a same chip as the counter based momentary speed monitor module 220.

In an embodiment, the counter based speed monitor module 220 is placed in a neighborhood of a critical path. The critical path has a delay that is substantially equivalent to a number of inversions. The counter based speed monitor module 220 is configured according to the number of inversions. In an example, a control vector is provided to soft-configure the counter based speed monitor module 220. In another example, the counter based speed monitor module 220 is hard-configured during design process. The process starts at S501, and proceeds to S510.

At S510, the test controller applies an initial voltage to the IC chip for operation. In an example, the initial voltage is a nominal voltage for operation.

At S520, the test controller checks the speed indicator signal 275. Specifically, the test controller controls the counter based speed monitor module 220 to generate the speed indicator signal 275, and then checks the speed indicator signal 275. In an embodiment, the test controller provides a control vector to the counter based speed monitor module 220 to start speed monitoring. Then, the counter based speed monitor module 220 generates the speed indicator signal 275 according to the process 400. In an example, the speed indicator signal 275 is set to logic "1" to indicate a delay error when the delay (the time for the number of inversions) is larger than a clock cycle; and the speed indicator signal 275 is cleared to logic "0" to indicate no delay error when the delay (the time for the number of inversions) is smaller than a clock cycle. When the speed indicator signal 275 indicates a delay error, the process proceeds to S530; otherwise, the process proceeds to S540.

At S530, the test controller outputs a voltage, such as the present voltage applied on the IC chip. The present voltage indicates a maximum voltage that causes a delay error, for example. Then, the process proceeds to S599 and terminates.

At S540, the test controller reduces the applied voltage on the IC chip. Then, the process returns to S520.

It is noted that the process 500 can be suitably adjusted in various aspects. In an example, the initial voltage is a relatively low voltage that causes a delay error, and the test controller increases the applied voltage until no delay error is detected.

Figure 6:
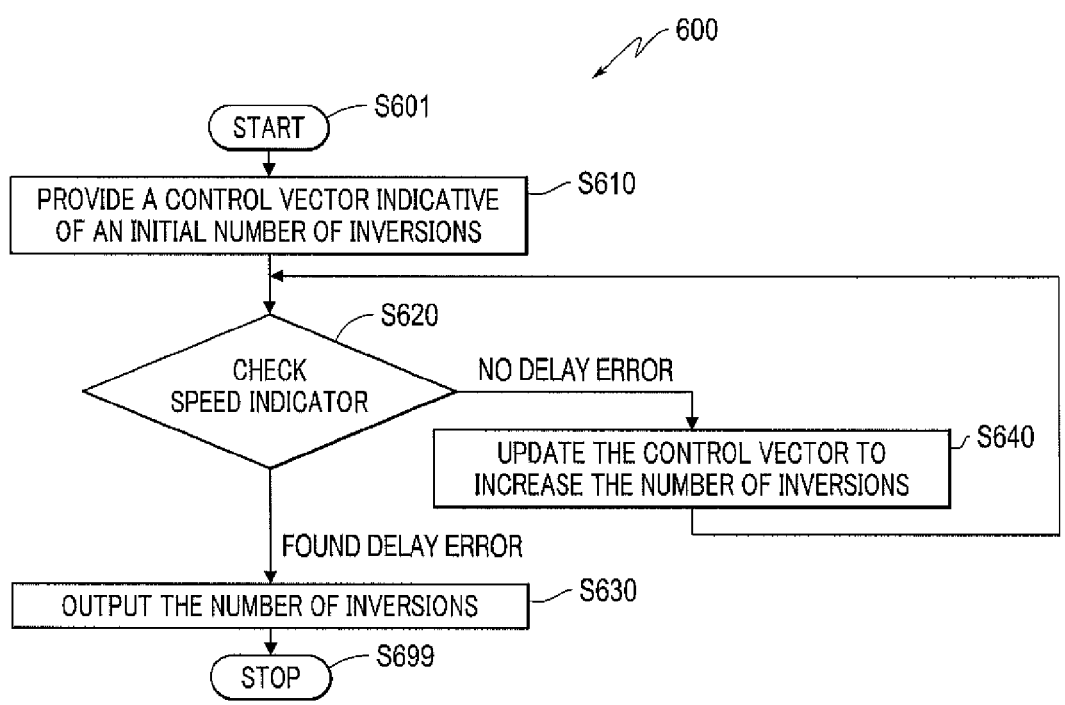
FIG. 6 shows a flowchart outlining a process example 600 for a test controller to detect a delay value according to an embodiment of the disclosure.

FIG. 6 shows a flowchart outlining a process example 600 for a test controller to characterize a delay value according to an embodiment of the disclosure. In an example, the test controller is within a tester that applies various tests on an IC chip having the counter based momentary speed monitor module 220. In another example, the test controller is a built-in self-test controller within a same chip as the counter based momentary speed monitor module 220.

In an example, the counter based speed monitor module 220 is placed at a location of the IC chip to determine variations, such as voltage variation, temperature variation, and the like, at the location. Specifically, the counter based speed monitor module 220 detects speed variations at the location. Further, the speed variations can be decomposed to a quick variation portion, and a slow variation portion, for example. The quick variation portion is due to environmental parameters that change quickly, such as voltage variation. The slow variation portion is due to environmental parameters that change slowly, such temperature variation.

The process 600 starts at S601, and proceeds to S610.

At S610, the test controller provides an initial control vector 281 to the counter based speed monitor module 220. In an example, the initial control vector 281 indicates an initial delay value, such as an initial number of inversions, for monitoring.

At S620, the test controller checks the speed indicator signal 275. Specifically, based on the provided control vector 281, the counter based speed monitor module 220 generates a speed indicator signal, such as the speed indicator signal 275, according to the process 400, for example. In an example, the speed indicator signal 275 is set to logic "1" to indicate a delay error when the delay (the time for the number of inversions) is larger than a clock cycle; and the speed indicator signal 275 is cleared to logic "0" to indicate no delay error when the delay (the time for the number of inversions) is smaller than a clock cycle. When the speed indicator signal indicates a delay error, the process proceeds to S630; otherwise, the process proceeds to S540.

At S630, the test controller outputs the number of inversions. Then, the process proceeds to S699 and terminates.

At S640, the test controller updates the control vector to increase the number of inversions for monitoring, and provides the updated control vector 281 to the counter based speed monitor module 220. Then, the process returns to S620.

It is noted that the process 600 can be suitably adjusted in various aspects. In an example, the initial number of inversions is a relatively large number that can cause a delay error. The test controller decreases the number of inversions until no delay error is detected.

Figure 7:
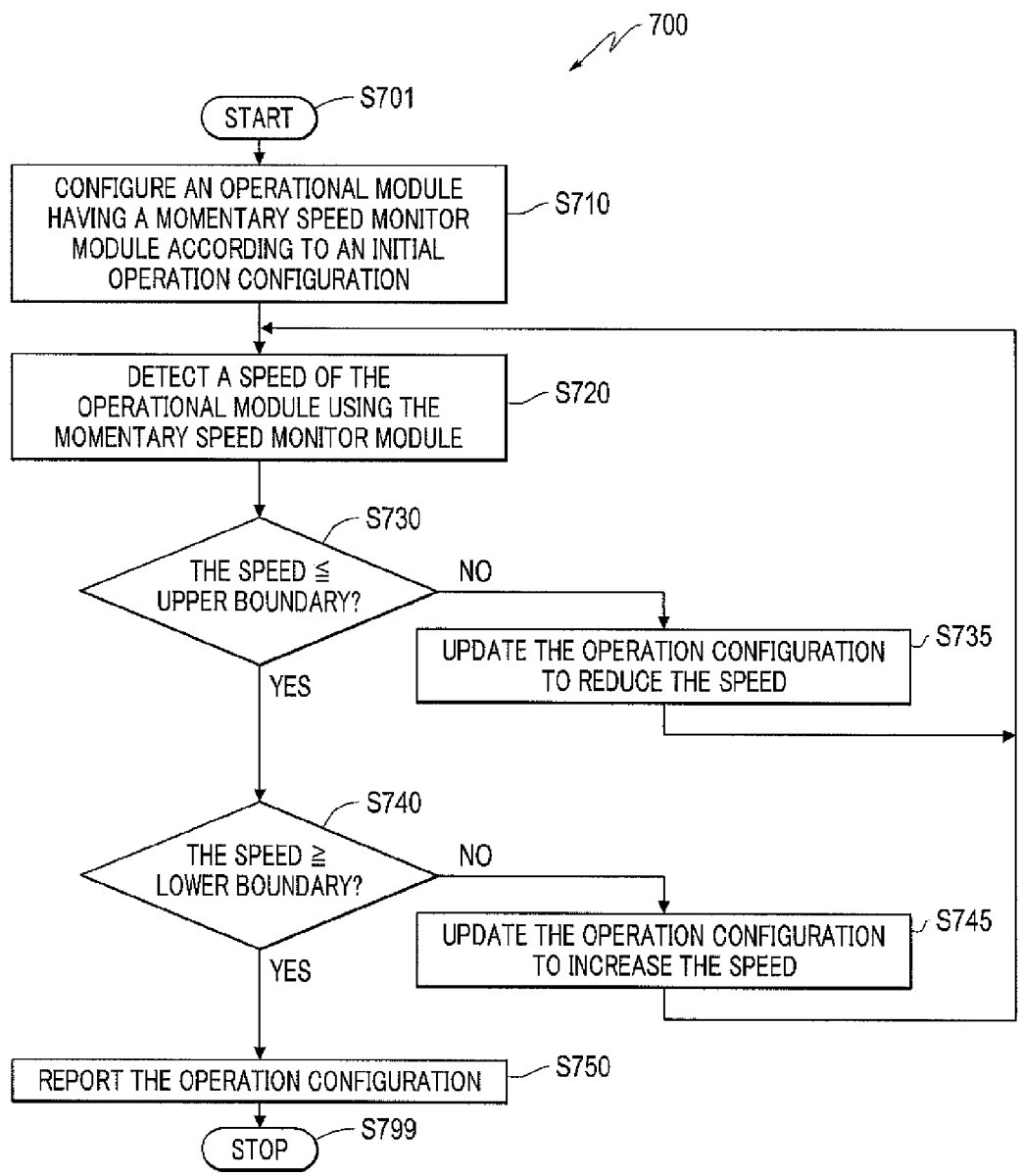
FIG. 7 shows a flowchart outlining a process example 700 for a speed controller to control a speed of an operational module based on a momentary speed monitor module according to an embodiment of the disclosure.

FIG. 7 shows a flowchart outlining a process example 700 for a speed controller to determine a speed-power configuration for an operational module according to an embodiment of the disclosure. The operational module includes a momentary speed monitor module, such as the momentary speed monitor module 220. The momentary speed monitor module 220 is suitably coupled to the operational module, such that the oscillation speed of the ring oscillator module reflects the operation speed of the operational module. The speed controller can be an off-chip speed controller or an on-chip speed controller.

In an embodiment, the operation speed has a lower speed boundary, and an upper speed boundary. The lower speed boundary corresponds to a speed constrain of the operational module. The upper speed boundary corresponds to a power constrain of the operational module. When the operation speed is slower than the lower speed boundary, delay errors can occur in the operational module. When the operation speed is faster than the upper speed boundary, the operational module consumes too much power. In an example, the operational module generates too much heat locally, and may have heat related errors. The speed controller can suitably adjust operation configurations, such as supply voltage, active capacitors of a charge pump, temperature, and the like, to control the operation speed of the operational module to stay between the lower speed boundary and the upper speed boundary.

The process 700 starts at S701 and proceeds to S710.

At S710, the speed controller configures the operational module according to an initial operation configuration.

At S720, the speed controller detects a speed of the operational module using the momentary speed monitor module 220. In an embodiment, the speed controller controls the momentary speed monitor module 220 according to process 600 to obtain a number of inversions that can occur in a clock cycle. The speed of the operation module is represented by a maximum number of inversions that can occur in a clock cycle.

At S730, the speed controller determines whether the speed is faster than the upper speed boundary. When the speed is faster than the upper speed boundary, the process proceeds to S740; otherwise, the process proceeds to S735.

At S735, the speed controller updates the operation configuration to reduce the speed of the operational module. In an embodiment, the speed controller reduces the supply voltage to the operational module. Then, the process returns to S720.

At S740, the speed controller determines whether the speed is slower than the lower speed boundary. When the speed is slower than the lower speed boundary, the process proceeds to S750; otherwise, the process proceeds to S745.

At S745, the speed controller updates the operation configuration to increase the speed of the operational module. In an embodiment, the speed controller increases the supply voltage to the operation module. Then, the process returns to S720.

At S750, the speed controller reports the operation configuration. The operation configuration can be suitably maintained to ensure the operation speed of the operational module is in the appropriate range. Then, the process proceeds to S799, and terminates.

It is noted that the process 700 can be suitably repeated to update the operation configuration.

It is noted that the counter based momentary speed monitor module 220 can be suitably modified for other purpose, such as a high resolution programmable clock generator, and the like.

Figure 8:
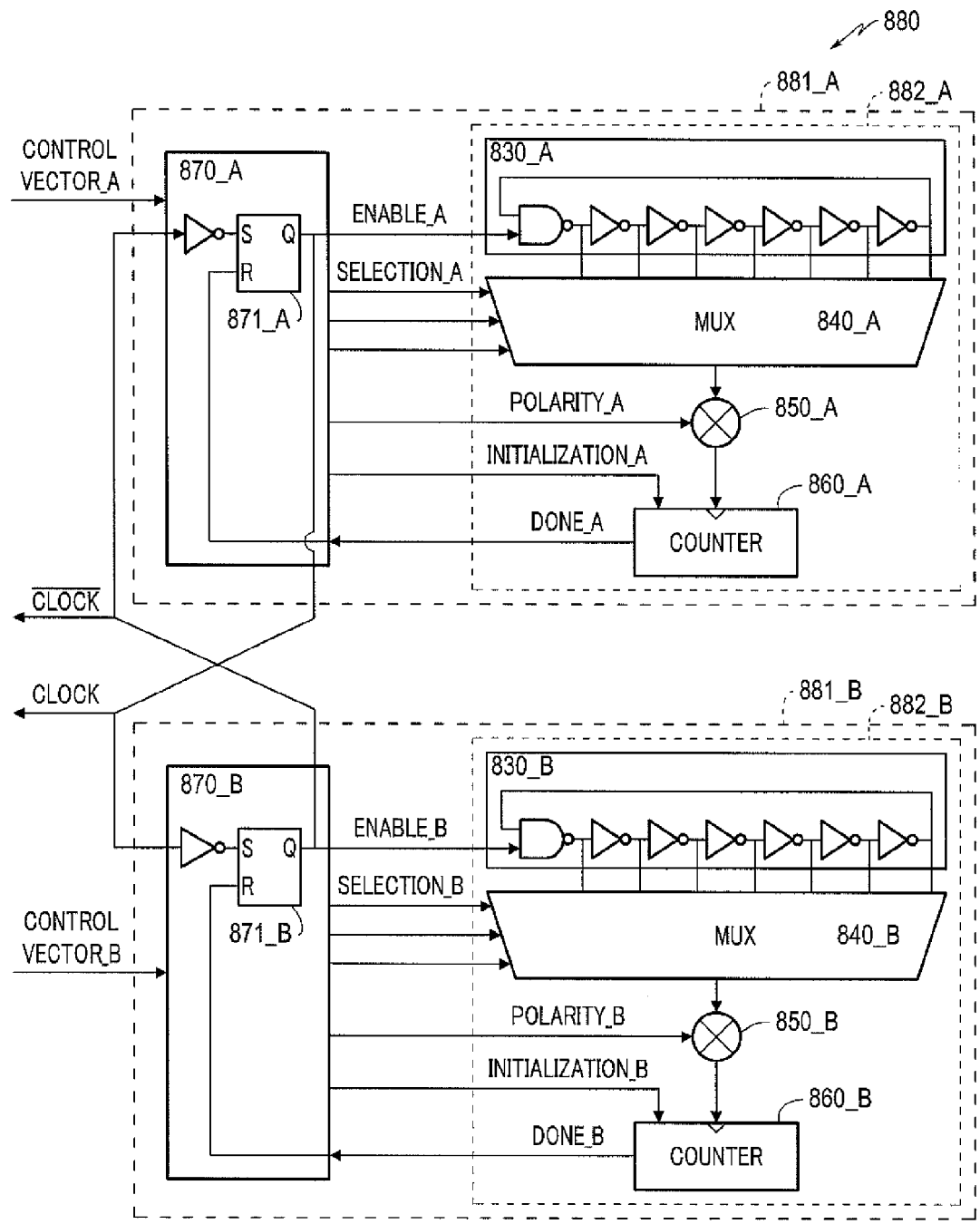
FIG. 8 shows a block diagram of a clock generator circuit example 880 according to an embodiment of the disclosure.

FIG. 8 shows a block diagram of a clock generator circuit example 880 according to an embodiment of the disclosure. The clock generator circuit 880 includes a first pulse generator 881_A and a second pulse generator 881_B cross-coupled together as shown in FIG. 8. The clock generator circuit 880 generates a pair of periodic signals CLOCK and $\overline{CLOCK}$. In an embodiment, the clock generator circuit 880 is integrated with other circuits on an IC chip, and provides the periodic signal CLOCK as a $\overline{CLOCK}$ signal to the other circuits. The period of the periodic signals CLOCK and $\overline{CLOCK}$ is a function of circuit delay time, and thus varies with process, voltage, and temperature changes. In addition, the period of the periodic signals CLOCK and $\overline{CLOCK}$ is programmable, and can be adjustable with a high resolution, such as a single inversion delay, a half inversion delay, and the like.

In the FIG. 8 example, the first pulse generator 881_A includes a controller 870_A and an inversion counter 882_A. Each time when the first pulse generator 881_A is triggered, the first pulse generator 881_A generates a pulse in the periodic signal CLOCK. The pulse has a first pulse width corresponding to a first delay time that is based on a first target number of inversions.

The inversion counter 882_A includes a ring oscillator module 830_A, a multiplexer module 840_A, an XOR module 850_A, and a counter module 860_A. The ring oscillator module 830_A is configured to propagate inversions, and the multiplexer module 840_A, the XOR module 850_A and the counter module 860_A form an edge capture module to capture a target transition edge in the ring oscillator module 830_A. The ring oscillator module 830_A, the multiplexer module 840_A, the XOR module 850_A and the counter module 860_A are similarly configured as the ring oscillator module 230, the multiplexer module 240, the XOR module 250 and the counter module 260; the description of these components has been provided above and will be omitted here for clarity purposes.

The inversion counter 882_A is configured to count inversions propagated in the ring oscillator module 830_A up to the first target number. The first target number is defined by the selection_A signal, the polarity_A signal, and the initialization_A signal. During operation, when the inversion counter 882_A is enabled, the inversion counter 882_A starts counting inversions propagated in the ring oscillator module 830_A. When the counted number of inversions reaches the first target number, the inversion counter 882_A outputs the done_A signal indicative of the first target number being reached.

In an embodiment, the counter module 860_A is reset according to the initialization_A signal by the done_A signal. In another embodiment, the counter module 860_A is reset according to the initialization_A signal in response to other signals, such as a signal (not shown) provided by the controller 870_A.

The controller 870_A includes suitable circuitry to provide the selection_A signal, the polarity_A signal and the initialization_A signal to define the first target number. In an example, the controller 870_A receives a control vector_A that is indicative of the first target number. Then, the controller 870_A provides the selection_A, polarity_A, and the initialization_A signals based on the control vector_A.

In addition, the controller 870_A includes suitable circuitry to generate pulses having the first pulse width. In an example, the first pulse width is about the delay time based on the first target number of inversions.

In the FIG. 8 example, the controller 870_A includes an S-R latch 871_A. During operation, in an example, when the first pulse generator 881_A is not triggered, the output (Q) of the S-R latch 871_A has a relatively low voltage corresponding to logic "0," and disables the inversion counter 882_A.

Further, when the first pulse generator 881_A is triggered, the S-R latch 871_A receives a set signal, for example, the input S switches from logic "0" to logic "1," (e.g., from a relatively low voltage to a relatively high voltage). Then, the output Q of the S-R latch 871_A switches from logic "0" to logic "1", and the periodic signal CLOCK also switches from logic "0" to logic "1" corresponding to a leading edge of a pulse.

When the output Q becomes logic "1," the ring oscillator module 830_A is enabled to start oscillation, and the inversion counter 882_A starts counting inversions propagated in the ring oscillator module 830_A.

When the inversion counter 882_A counts to the first target number, the counter module 860_A generates the done_A signal. In an example, the done_A signal uses a pulse having a relatively small pulse width to indicate that the inversion counter 882_A has counted to the first target number.

The done_A signal resets the S-R latch 871_A, thus the output Q of the S-R latch 871_A switches from logic "1" to logic "0", and the periodic signal CLOCK also switches from logic "1" to logic "0" corresponding to a trailing edge of the pulse. When the output Q becomes logic "0," the ring oscillator module 830_A is disabled. The pulse generated by the first pulse generator 881_A has the first pulse width that is about the delay time of the first target number of inversions in the ring oscillator module 830_A.

The second pulse generator 881_B operates similarly to the first pulse generator 881_A. Each time when the second pulse generator 881_B is triggered, the second pulse generator 881_B generates a pulse in the periodic signal $\overline{CLOCK}$. The pulse has a second pulse width corresponding to a second delay time that is based on a second target number of inversions.

The second pulse generator 881_B utilizes certain components that are identical or equivalent to those used in the first pulse generator 881_A; the description of these components has been provided above and will be omitted here for clarity purposes.

It is noted that the second target number can be the same as the first target number or can be different from the first target number.

In the FIG. 8 example, the pulse generated by the second pulse generator 881_B has the second pulse width that is about the delay time of the second target number of inversions in the ring oscillator module 830_B. Further, the second pulse width can be the same as the first pulse width or can be different from the first pulse width.

The first pulse generator 881_A and the second pulse generator 881_B are cross-coupled together, such that a trailing edge generated by one of the pulse generators triggers the other pulse generator to start generating a pulse. Thus, the first pulse generator 881_A and the second pulse generator 881_B alternatively generate pulses. The generated pulses form the pair of periodic signals CLOCK and $\overline{CLOCK}$. In the FIG. 8 example, the period of periodic signals CLOCK and $\overline{CLOCK}$ is the sum of the first pulse width and the second pulse width.

It is noted that the clock generator circuit 880 can be suitably modified. In an example, an enable circuit is suitably added in the clock generator circuit 880 to enable or disable the clock generator circuit 880 to generate the periodic signals CLOCK and $\overline{CLOCK}$.

It is noted that the first pulse width and the second pulse width can be adjusted by providing suitable control vector_A and control vector_B. In addition, the first pulse width and the second pulse width can be adjusted in the resolution of a single inversion.

According to an aspect of the disclosure, the period of the periodic signals CLOCK and is a function of circuit delay time, and varies with changes in process, voltage, and temperature. In an embodiment, the periodic signal CLOCK is used as a clock signal in a circuit. In an example, the clock generator circuit 880 is suitably configured that the period of the periodic signal CLOCK is longer than delays of critical paths in the circuit under a nominal case condition. Because the period of the periodic signal CLOCK tracks delay variations due to the supply voltage variation, the temperature variation, the process variation, and the like in the circuit, the period of the periodic signal CLOCK is also longer than the delays of the critical paths in the circuit under worst case conditions. Thus, the period of the periodic signal CLOCK does not need to be overdesigned with margins for the worst case conditions, and the circuit does not need to be tested for the worst case conditions in an example.

According to an embodiment of the disclosure, the clock generator circuit 880 can be used in a globally asynchronous locally synchronous system to generate clock signals. For example, the system includes a plurality of circuit blocks. Each circuit block includes a clock generator circuit 880 to generate a clock signal for the operations of circuits in the circuit block, thus the operations of the circuits in the same circuit block are synchronous. The operations of circuits in different circuit blocks can be asynchronous. The system can use synchronizer circuits as interfaces to enable communications among the circuit blocks.

Figure 9:
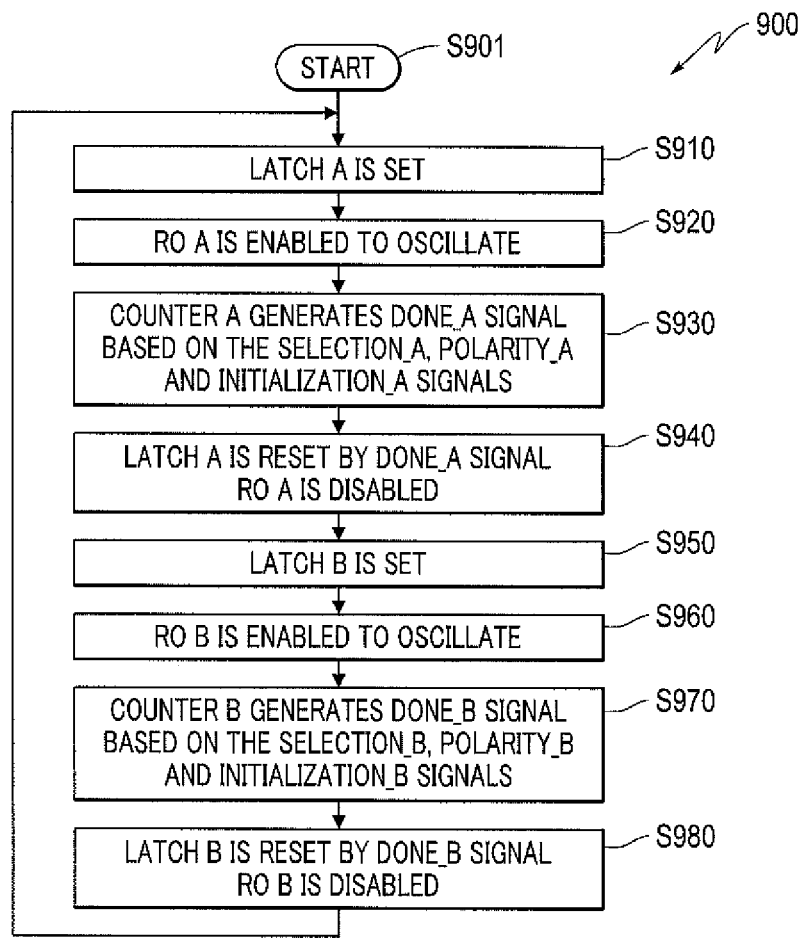
FIG. 9 shows a flowchart outlining a process example 900 for a clock generator to generate a clock signal according to an embodiment of the disclosure.

FIG. 9 shows a flowchart outlining a process example 900 for a clock generator, such as the clock generator 880, to generate a clock signal according to an embodiment of the disclosure. The process starts at S901 and proceeds to S910.

At S910, the first pulse generator 881_A is triggered, and the S-R latch 871_A receives a set signal, for example, the input S switches from logic "0" to logic "1." Then, the output Q of the S-R latch 871_A switches from logic "0" to logic "1", and the periodic signal CLOCK also switches from logic "0" to logic "1" corresponding to a leading edge of a first pulse.

At S920, when the output Q of the S-R latch 871_A becomes logic "1," the ring oscillator module 830_A is enabled to start oscillation, and the inversion counter 882_A starts counting inversions that propagate in the ring oscillator module 830_A.

At S930, when the inversion counter 882_A counts to the first target number that is defined by the selection_A, polarity_A, and initialization_A signals, the counter module 860_A generates the done_A signal. In an example, the done_A signal uses a pulse having a relatively small pulse width to indicate that the inversion counter 882_A has counted to the first target number.

At S940, the done_A signal resets the S-R latch 871_A, thus the output Q of the S-R latch 871_A switches from logic "1" to logic "0", and the periodic signal CLOCK also switches from logic "1" to logic "0" corresponding to a trailing edge of the first pulse. When the output Q of the S-R latch 871_A becomes logic "0," the ring oscillator module 830_A is disabled.

At S950, the trailing edge of the first pulse triggers the second pulse generator 881_B. Specifically, the S-R latch 871_B receives a set signal in response to the trailing edge of the first pulse, for example, the input S of the S-R latch 871_B switches from logic "0" to logic "1." Then, the output Q of the S-R latch 871_B switches from logic "0" to logic "1", and the periodic signal $\overline{CLOCK}$ also switches from logic "0" to logic "1" corresponding to a leading edge of a second pulse.

At S960, when the output Q of the S-R latch 871_B becomes logic "1," the ring oscillator module 830_B is enabled to start oscillation, and the inversion counter 882_B starts counting inversions that propagate in the ring oscillator module 830_B.

At S970, when the inversion counter 882_B counts to the second target number that is defined by the selection_B, polarity_B, and initialization_B signals, the counter module 860_B generates the done_B signal. In an example, the done_B signal uses a pulse having a relatively small pulse width to indicate that the inversion counter 882_B has counted to the second target number.

At S980, the done_B signal resets the S-R latch 871_B, thus the output Q of the S-R latch 871_B switches from logic "1" to logic "0", and the periodic signal $\overline{CLOCK}$ also switches from logic "1" to logic "0" corresponding to a trailing edge of the second pulse. When the output Q of the S-R latch 871_B becomes logic "0," the ring oscillator module 830_B is disabled. The process returns to S910 where the trailing edge of the second pulse triggers the first pulse generator 881_A to generate another first pulse.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A clock generator circuit, comprising:
    a first pulse generator configured to output first pulses, each first pulse having a first leading edge, a first trailing edge, and a first pulse width corresponding to a first delay time that is based on a first number of inversions; and
    a second pulse generator configured to output second pulses, each second pulse having a second leading edge, a second trailing edge, and a second pulse width corresponding to a second delay time that is based on a second number of inversions,
    wherein the first pulse generator includes a first ring oscillator module including first inversion stages, a first edge capture module configured to capture a first target edge of a first signal propagating in the first ring oscillator module corresponding to the first number of inversions, and a first controller configured to output the first leading edge and control the first ring oscillator module to start oscillating in response to the second trailing edge, and to output the first trailing edge when the first edge capture module captures the first target edge, and
    wherein the first pulse generator and the second pulse generator are cross-coupled, such that the first pulse generator outputs one of the first pulses in response to the second trailing edge, and the second pulse generator outputs one of the second pulses in response to the first trailing edge.

2. The clock generator circuit of claim 1, wherein the second pulse generator comprises:
    a second ring oscillator module including second inversion stages;
    a second edge capture module configured to capture a second target edge of a second signal propagating in the second ring oscillator module corresponding to the second number of inversions; and
    a second controller configured to output the second leading edge and control the second ring oscillator module to start oscillating in response to the first trailing edge, and to output the second trailing edge when the second edge capture module captures the second target edge.

3. The clock generator circuit of claim 1, wherein the first pulse generator further comprises:
    a selection module configured to select a stage out of the first inversion stages of the first ring oscillator module that the first signal propagates to the stage at the first number of inversions.

4. The clock generator circuit of claim 3, wherein the selection module includes a multiplexer module coupled to the first inversion stages of the first ring oscillator module.

5. The clock generator circuit of claim 1, wherein the first edge capture module further comprises a counter module configured to count transition edges.

6. The clock generator circuit of claim 5, wherein:
    the first controller is configured to provide an initialization signal to the counter module based on the first target edge; and
    the counter module is initialized based on the initialization signal, and is configured to capture the first target edge when the counter module overflows.

7. The clock generator circuit of claim 6, wherein the first edge capture module further comprises an exclusive-or (XOR) module configured to adjust a transition direction of the transition edges.

8. The clock generator circuit of claim 7, wherein the first controller is configured to provide a polarity signal to the XOR module for adjusting the transition direction of the transition edges.

9. The clock generator circuit of claim 1, wherein the first ring oscillator module includes an inversion stage having at least two different inversion delays.

10. A method of generating a clock signal, comprising:
    generating first pulses, by a first pulse generator, in response to trailing edges of second pulses generated by a second pulse generator, a first pulse width of the first pulses corresponding to a first delay time that is based on a first number of inversions; and generating the second pulses, by the second pulse generator, in response to trailing edges of the first pulses generated by the first pulse generator, a second pulse width of the second pulses corresponding to a second delay time that is based on a second number of inversions, wherein generating the first pulses, by the first pulse generator, in response to the trailing edges of the second pulses generated by the second pulse generator includes outputting a leading edge of one of the first pulses and enabling a ring oscillator to oscillate in response to a trailing edge of one of the second pulses, and outputting a trailing edge of said one of the first pulses when the ring oscillator propagates the first number of inversions.

11. The method of claim 10, further comprising capturing a target transition edge at a stage of the ring oscillator.

12. The method of claim 11, further comprising selecting the stage from a plurality of stages of the ring oscillator based on the first number of inversions.

13. The method of claim 11, wherein capturing the target transition edge at the stage of the ring oscillator further comprises:

counting a number of transition edges at the stage; and capturing the target transition edge when the counted number is larger than a threshold.

14. The method of claim 13, wherein counting the number of transition edges at the stage further comprises at least one of:

counting a number of rising edges at the stage; and counting a number of falling edges at the stage.

15. The method of claim 13, wherein capturing the target transition edge when the counted number is larger than the threshold further comprises:

initializing a counter based on the target transition edge; and capturing the target transition edge when the counter overflows.

16. An integrated circuit (IC) chip, comprising:

a clock generator circuit that includes:

a first pulse generator configured to output first pulses, each first pulse having a first leading edge, a first trailing edge, and a first pulse width corresponding to a first delay time that is based on a first number of inversions; and a second pulse generator configured to output second pulses, each second pulse having a second leading edge, a second trailing edge, and a second pulse width corresponding to a second delay time that is based on a second number of inversions, wherein the first pulse generator includes a first ring oscillator module including first inversion stages, a first edge capture module configured to capture a first target edge of a first signal propagating in the first ring oscillator module corresponding to the first number of inversions, and a first controller configured to output the first leading edge and control the first ring oscillator module to start oscillating in response to the second trailing edge, and to output the first trailing edge when the first edge capture module captures the first target edge, and wherein the first pulse generator and the second pulse generator are cross-coupled, such that the first pulse generator outputs one of the first pulses in response to the second trailing edge, and the second pulse generator outputs one of the second pulses in response to the first trailing edge.

17. The IC chip of claim 16, further comprising a functional circuit configured to operate in response to a clock signal formed based on the first pulses.

* * * * *